(12) United States Patent
Pontarollo et al.

(10) Patent No.: US 9,607,906 B2
(45) Date of Patent: Mar. 28, 2017

(54) INTEGRATED CIRCUIT CHIP WITH CORRECTED TEMPERATURE DRIFT

(71) Applicant: STMicroelectronics (Grenoble 2) SAS, Grenoble (FR)

(72) Inventors: Serge Pontarollo, Saint-Egreve (FR); Philippe Maige, Seyssinet-Pariset (FR)

(73) Assignee: STMICROELECTRONICS (GRENOBLE 2) SAS, Grenoble (FR)

( * ) Notice: Subject to any disclaimer, the term of this patent is extended or adjusted under 35 U.S.C. 154(b) by 0 days.

(21) Appl. No.: 14/746,235

(22) Filed: Jun. 22, 2015

(65) Prior Publication Data
US 2016/0049341 A1 Feb. 18, 2016

(30) Foreign Application Priority Data

Aug. 13, 2014 (FR) .................................... 14 57792

(51) Int. Cl.
| | |
|---|---|
| *H01L 23/58* | (2006.01) |
| *H01L 21/66* | (2006.01) |
| *H01L 27/02* | (2006.01) |
| *G01K 7/01* | (2006.01) |
| *H01L 23/34* | (2006.01) |

(52) U.S. Cl.
CPC ............. *H01L 22/20* (2013.01); *G01K 7/01* (2013.01); *H01L 22/14* (2013.01); *H01L 23/345* (2013.01); *H01L 27/0211* (2013.01); *H01L 2924/0002* (2013.01)

(58) Field of Classification Search
CPC ... H01L 22/14; H01L 23/345; H01L 27/0211; H01L 22/20; G01K 7/01
See application file for complete search history.

(56) References Cited

U.S. PATENT DOCUMENTS

| | | | | |
|---|---|---|---|---|
| 4,730,160 A | * | 3/1988 | Cusack | G01N 25/18 219/209 |
| 6,460,411 B1 | * | 10/2002 | Kersjes | G01F 1/6845 73/204.26 |
| 2006/0278950 A1 | * | 12/2006 | Tai | H01L 21/76264 257/501 |
| 2012/0139648 A1 | * | 6/2012 | Asamura | H03L 1/04 331/70 |
| 2014/0061643 A1 | * | 3/2014 | Kaeriyama | H01L 24/49 257/48 |

OTHER PUBLICATIONS

INPI Search Report and Written Opinion for FR1457792 dated Mar. 31, 2015 (9 pages).
"MT-037 Tutorial Amp Input Offset Voltage," Oct. 1, 2008, pp. 1-10, XP055180596, http://www.analog.com/media/en/training-seminars/tutorials/MT-037.pdf.
Kersjes R et al: "A Fast Liquid Flow Sensor With Thermal Isolation by Oxide-Filled Trenches," Sensors and Actuators A, Elsevier Sequoia S.A., Lausanne, CH, vol. 47, No. 1-3, Mar. 1, 1995, pp. 373-379, XP027220171, ISSN 0924-4247.

* cited by examiner

*Primary Examiner* — A. Sefer
(74) *Attorney, Agent, or Firm* — Gardere Wynne Sewell LLP

(57) ABSTRACT

An integrated circuit chip includes trenches at least partially surrounding a critical portion of a circuit that is sensitive to temperature variations. The trenches are locally interrupted in order to permit circuit connections to pass between the critical portion and an outer portion containing a remainder of the circuit. The critical portion includes heating resistors and a temperature sensor.

19 Claims, 2 Drawing Sheets

INTEGRATED CIRCUIT CHIP WITH CORRECTED TEMPERATURE DRIFT

PRIORITY CLAIM

This application claims the priority benefit of French Patent Application No. 1457792, filed on Aug. 13, 2014, the contents of which is hereby incorporated by reference in its entirety to the maximum extent allowable by law.

TECHNICAL FIELD

The present disclosure relates to chips containing integrated circuits having one or a plurality of characteristics capable of varying along with temperature.

BACKGROUND

Certain integrated circuits, for example, operational amplifiers or reference voltage generators, are capable of drifting in temperature during their operation if some of their parameters are not very accurately adjusted. Even though the parameters of these circuits are calculated in order to avoid such drifts, technological manufacturing fluctuations result in that the various circuits manufactured on a same wafer or circuits manufactured on different wafers will exhibit technological variations such that the manufactured circuits drift in temperature.

An example characteristic of an integrated circuit capable of drifting in temperature if the parameters of this circuit are not accurately adjusted is the offset voltage between the inverting input and the non-inverting input of an operational amplifier.

Thus, to be able to provide integrated circuits which do not drift in temperature, manufacturers have to carry out wafer tests for each manufactured circuit and to adjust the parameters of the circuits so that they do not drift in temperature. Such an adjustment is for example performed by providing in the integrated circuits resistor networks where elements are disconnected by laser trimming.

More particularly, in the case of the offset voltage of an operational amplifier, four-point probe measurements are carried out at a plurality of temperatures, currently two temperatures, and the way to adjust the resistances of the above-mentioned resistance networks is determined according to these measurements. As an example, means for adjusting the offset voltage according to the measurements performed at various temperatures are described in the ANALOG DEVICES document entitled: MT-037 TUTORIAL, October 2008 (incorporated herein by reference).

This requires, as already mentioned, carrying out measurements at two different temperatures. To achieve this, the wafer is placed on a heating support. The support is first maintained at the ambient temperature and then heated to reach a high temperature, for example, 100° C. At each of these temperatures, four-point probe measurements are performed and the previously-described laser adjustment method can then be implemented.

A difficulty of such a method is to take the wafer to two different temperatures. In practice, passing by means of a heating support from a first stable temperature to a second stable temperature takes several minutes. This duration is far from being negligible as compared with the total chip manufacturing time and has a significant impact on the total manufacturing cost of a wafer.

The test time thus needs to be decreased.

SUMMARY

Thus, an embodiment provides an integrated circuit chip, comprising trenches surrounding a critical portion of the circuit capable of making it sensitive to temperature variations, such trenches crossing the chip and being locally interrupted to let through connections between said portion and the rest of the circuit; and heating resistors and a temperature sensor placed in said circuit portion.

According to an embodiment, the temperature sensor is a PN junction diode.

According to an embodiment, the heating resistors are diffused resistors.

According to an embodiment, the critical portion is surrounded with a double network of trenches, the trenches being formed to define arms connecting the critical portion of the circuit to the rest of the chip.

An embodiment provides a method of forming an integrated circuit chip, the integrated circuit comprising a critical portion capable of making it sensitive to temperature variations, comprising the steps of identifying the critical portion of the integrated circuit; gathering the elements of this critical portion in an insulated portion surrounded with trenches; arranging in the insulated portion heating resistors and a temperature sensor; testing the chip at various temperatures; and adjusting elements of the critical portion of the chip.

According to an embodiment, the method further comprises the steps of assembling the wafer containing the chips on a support via an insulating layer interrupted at the locations of the critical portions of the chip; and coating the chip with a cap, with an interposed insulating layer interrupted above the critical portion of the chip.

BRIEF DESCRIPTION OF THE DRAWINGS

The foregoing and other features and advantages will be discussed in detail in the following non-limiting description of specific embodiments in connection with the accompanying drawings.

As usual in the representation of integrated circuits, the drawings are not to scale.

DETAILED DESCRIPTION

It is here desired to perform a test of the above-described type at different temperatures while avoiding the long time currently necessary to take a wafer to two different temperatures.

To achieve this, a different topology of the integrated circuits contained in a chip is herein provided. More particularly, it is provided to identify the critical elements of an integrated circuit which, after technological fluctuations, are capable of making the integrated circuit sensitive to temperature variations. Such critical elements are gathered in a portion of the chip which is thermally insulated from the rest of the chip. It is also provided to incorporate in this insulated portion of the chip heating resistors and a temperature sensor. Thus, the insulated portion of the chip which has a small surface area as compared with the total chip surface area can be very rapidly heated and tests such as previously described can be performed within a short time. As will be seen hereafter, this short time may be in from 10 to 100 milliseconds, for example, 20 ms, instead of a duration in the range from 5 to 15 minutes, for example, 10 minutes, in the case where a wafer laid on a heating support is used.

It should be noted that an advantage of such a short time taken by the critical elements of a chip capable of inducing temperature drifts to pass from one temperature to another is that tests can be carried out at more than two temperatures, for example, three or four, which further improve the quality of the test results and of the corrections performed to make the circuit temperature-stable.

Figure 1A:
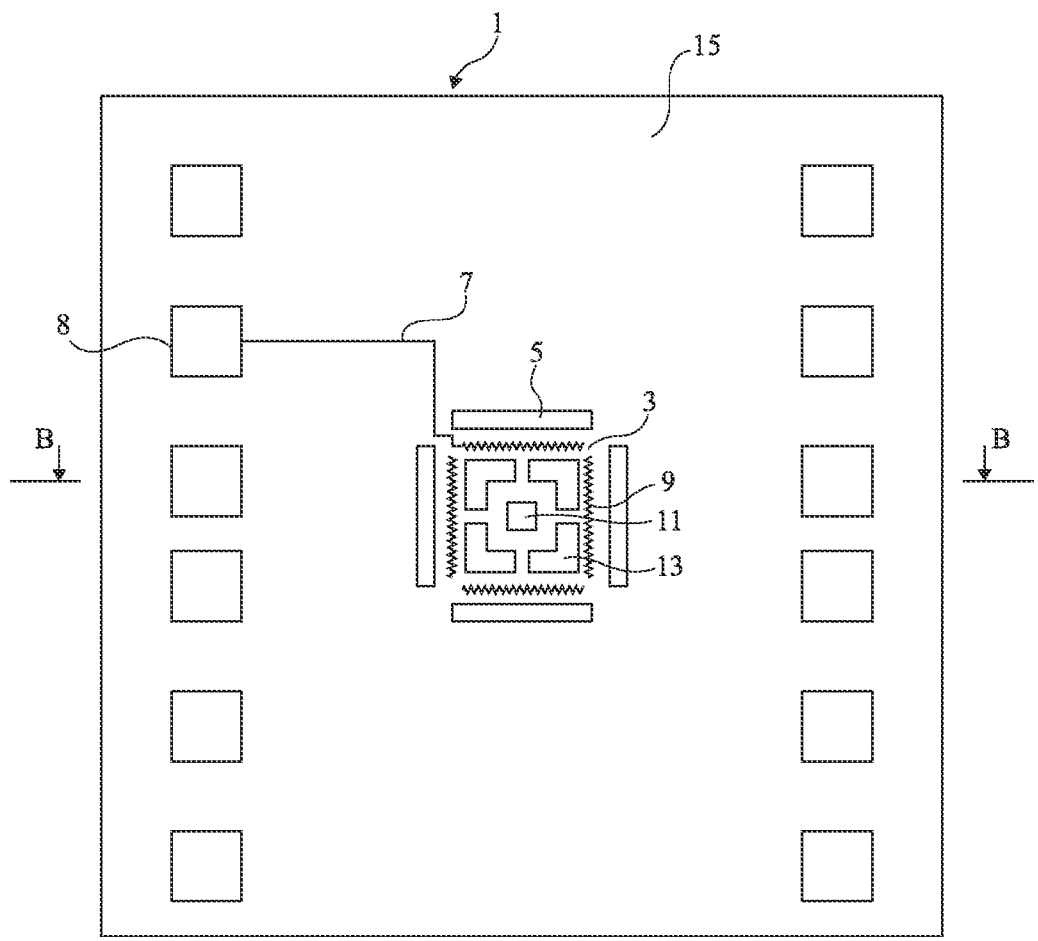
FIG. 1A is a top view of an embodiment of a chip comprising a temperature-corrected integrated circuit.
Figure 1B:
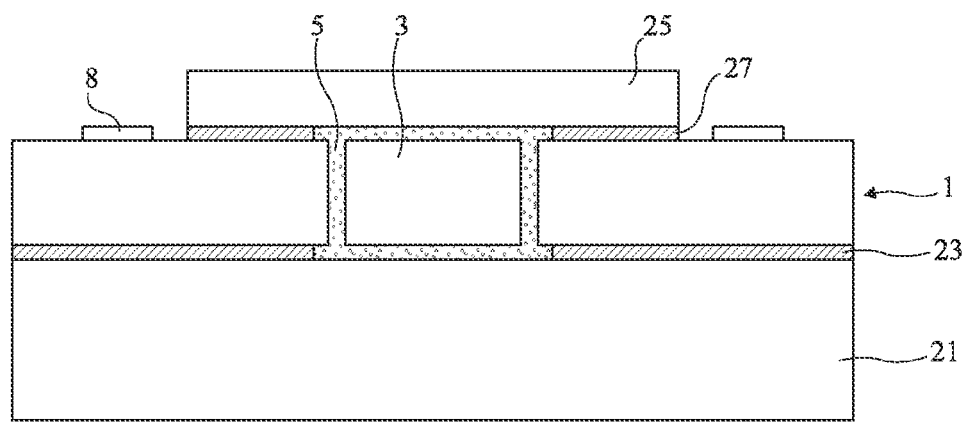
FIG. 1B is a cross-section view along plane BB of FIG. 1A.

FIGS. 1A and 1B respectively are a top view and a cross-section view of an embodiment of a chip 1 of a semiconductor wafer.

A single chip is shown in these drawings. It should however be understood that, during test operations, the chip is not sawn and is still part of a semiconductor wafer. In the integrated circuit contained in the chip, the critical elements, that is, those which may cause temperature drifts in the resulting integrated circuit because of their variations due to fluctuations of technological parameters, are gathered in a portion 3 of this chip, shown as an example as being a central portion of the chip. Portion 3 is at least partially surrounded by through trenches 5. Four trenches 5 substantially defining edges of a square have been shown herein. The corners of the trenches do not join to each other, in an embodiment, so that insulated portion 3 remains mechanically attached to the rest of the chip and that connection conductors 7 can extend from insulated portion 3 of the chip to connection pads 8 or other chip elements. Insulated portion 3 of the chip particularly comprises heating resistors 9 and a temperature sensor 11. The critical elements of the integrated circuit have also been illustrated in the form of blocks 13. In the case where the integrated circuit contained in chip 1 is an operational amplifier, the inventors have noted that the portions of this operational amplifier capable of causing drifts of the offset voltage according to temperature essentially correspond to the input stage of this operational amplifier. Blocks 13 then correspond to the elements of this input stage. The other elements of the operational amplifier are gathered in the remaining portion 15 of the chip.

As an example, temperature sensor 11 is a diode which, when it is crossed by a constant current, has a voltage which varies by −2 mV/° C.

As an example, heating resistors 9 are resistors formed by areas diffused in the semiconductor, for example, silicon, of the chip.

FIG. 1B shows in further detail an example of chip mounting, such a mounting being preferably performed while the chips are still assembled in a wafer. The silicon wafer, preferably a thinned layer, is mounted on a support 21, with an interposed insulating layer 23, for example, silicon oxide, the insulating layer being interrupted at the level of the central portion of the chip. Further, a cap 25, also preferably made of silicon, is assembled on the upper surface of the wafer, with an interposed insulating layer 27, insulating layer 27 being interrupted opposite the central portion of the chip. There thus remains in trenches 5, under the central portion of the chip and above the central portion of the chip, a void improving the thermal insulation of the chip. In practical embodiments, it may be preferred to leave in place the void only at the level of trenches 5 and to also coat the upper and lower surfaces of the chip with an insulating material.

As an example of numerical values, a square chip having lateral dimensions in the range from 0.5 to 1.5 mm, for example, 1 mm, is considered. The case where the insulated portion also has a square shape is considered. In the case of an operational amplifier, this central portion may have lateral dimensions in the range from 250 to 350 µm, for example, 300 µm. The trenches may have a width in the range from 20 to 50 µm, for example, 30 µm.

This shows that the dimensions of the critical portion surrounded with trenches of the integrated circuit are very small as compared with the total chip dimensions (surface area at least 10 times smaller in the above example). As a result, the insulated portion heating time can be very short as compared with the time required to heat a full wafer. As an example, as previously indicated, this heating time may be in the range from 10 to 100 ms, for example, 20 ms, while it should be reminded that the time taken to heat a wafer on a heating support to reach a stable temperature is in the order of some ten minutes.

Figure 2:
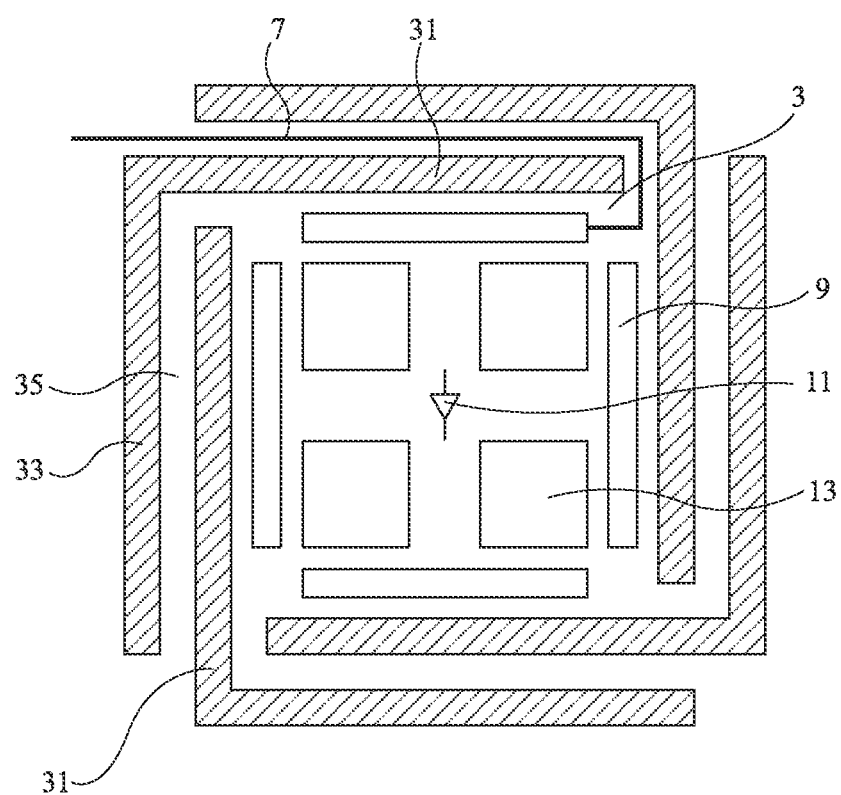
FIG. 2 is a top view of a specific embodiment of a chip comprising a temperature-corrected integrated circuit.

FIG. 2 is a top view of a specific embodiment of a chip such as previously described. FIG. 2 shows the same elements as in FIGS. 1A and 1B designated with the same reference numerals, that is, a central portion 3, heating resistors 9, a temperature sensor 11 represented by a diode diagram, and critical elements 13 of an integrated circuit. In this embodiment, the central portion is surrounded with a double trench. Each trench comprises a portion 31 delimiting the central portion of the chip and a portion 33 orthogonal to portion 31 and extending parallel to another portion 31 orthogonal to the first one, and outside thereof. Thus, these trenches delimit arms 35 connecting the central portion of the chip to the rest of the chip. These arms 35 may support connections 7 connecting elements of the insulated portion of the chip to pads of the chip or to other elements of the peripheral portion of the chip.

It should be noted by those skilled in the art that the surface area occupied by an integrated circuit in the embodiment described herein is slightly larger than the surface area of a conventional chip having no trenches of thermal insulation of a portion of the integrated circuit. However, economic calculations have shown that the costs resulting from this surface area increase are largely compensated for by the gain resulting from the decrease of the durations of four-point probe measurements on an integrated circuit wafer.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:
1. An integrated circuit chip, comprising:
an integrated circuit semiconductor layer including a plurality of trenches at least partially surrounding a perimeter of a critical portion of the integrated circuit semiconductor layer;
wherein said trenches are locally disconnected from each other;
one or more electrical connections passing along a portion of the integrated circuit semiconductor layer where the trenches are locally disconnected from each other, said electrical connections extending between said critical portion and an outer portion of the integrated circuit semiconductor layer;

one or more heating resistors placed in said critical portion and configured to vary temperature of said critical portion;

a circuit including a first circuit part located in the outer portion of the integrated circuit semiconductor layer and a second circuit part located in the critical portion of the integrated circuit semiconductor layer, said second circuit part comprising circuitry sensitive to temperature variation; and a temperature sensor placed in said critical portion.

2. The chip of claim 1, wherein the temperature sensor is a PN-junction diode.

3. The chip of claim 1, wherein the heating resistors are diffused resistors.

4. The chip of claim 1, wherein said plurality of trenches comprises a double network of trenches surrounding the critical portion, the trenches of said double network of trenches being formed to define arms connecting the critical portion of the integrated circuit ship to the outer portion of the integrated circuit chip.

5. The chip of claim 1, comprising a semiconductor layer supported by, but insulated from, an underlying support layer, wherein said trenches extend to a depth which passes completely through a thickness of the semiconductor layer.

6. The chip of claim 1, wherein a bottom of said critical portion is insulated from said underlying support layer.

7. The chip of claim 1, further comprising a cap layer mounted to the outer portion of the integrated circuit chip and extending over, but insulated from, said critical portion.

8. The chip of claim 1, wherein said circuit comprises an amplifier.

9. The chip of claim 8, wherein said circuitry sensitive to temperature variation affects offset voltage of the amplifier.

10. The chip of claim 8, wherein said second circuit part which comprises said circuitry sensitive to temperature variation comprises an input stage of said amplifier.

11. An integrated circuit chip, comprising:

a plurality of trenches at least partially surrounding an inner portion of an integrated circuit substrate that includes circuitry sensitive to temperature variation;

wherein said trenches are locally interrupted at regions through which electrical connections pass between said inner portion and an outer portion of the integrated circuit substrate which surrounds said inner portion; and heating resistors placed in said inner portion and configured to vary temperature of the inner portion;

an amplifier including a first circuit part in the outer portion of the integrated circuit substrate and a second circuit part which comprises said circuitry sensitive to temperature variation; and a temperature sensor placed in said inner portion.

12. The chip of claim 11, wherein the temperature sensor is a PN-junction diode.

13. The chip of claim 11, wherein the heating resistors are diffused resistors.

14. The chip of claim 11, wherein said plurality of trenches comprises a double network of trenches surrounding the inner portion, the trenches of said double network of trenches being formed to define arms connecting the inner portion of the integrated circuit ship to the outer portion of the integrated circuit chip.

15. The chip of claim 11, comprising a semiconductor layer supported by, but insulated from, an underlying support layer, wherein said trenches extend to a depth which passes completely through a thickness of the semiconductor layer.

16. The chip of claim 11, wherein a bottom of said inner portion is insulated from said underlying support layer.

17. The chip of claim 11, further comprising a cap layer mounted to the outer portion of the integrated circuit chip and extending over, but insulated from, said inner portion.

18. The chip of claim 11, wherein said circuitry sensitive to temperature variation affects offset voltage of the amplifier.

19. The chip of claim 11, wherein said second circuit part which comprises said circuitry sensitive to temperature variation comprises an input stage of said amplifier.

* * * * *